(12) United States Patent
Fukunaga

(10) Patent No.: US 6,795,469 B2
(45) Date of Patent: Sep. 21, 2004

(54) SEMICONDUCTOR LASER ELEMENT

(75) Inventor: Toshiaki Fukunaga, Kaisei-machi (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 0 days.

(21) Appl. No.: 10/291,636

(22) Filed: Nov. 12, 2002

(65) Prior Publication Data
US 2003/0091082 A1 May 15, 2003

(30) Foreign Application Priority Data
Nov. 14, 2001 (JP) ........................................ 2001-348447

(51) Int. Cl.⁷ .................................................. H01S 3/19
(52) U.S. Cl. ............................ 372/45; 372/46; 372/43
(58) Field of Search ............................ 372/45, 46, 44, 372/43

(56) References Cited

U.S. PATENT DOCUMENTS 5,317,586 A * 5/1994 Thornton et al. ............. 372/45
5,835,516 A * 11/1998 Miyashita et al. ............ 372/46
6,542,528 B1 * 4/2003 Sato et al. ..................... 372/45

OTHER PUBLICATIONS

"Abstracts of the Spring Meeting of the Japan Society of Applied Physics", 1997, 29a–PA–19.
IEEE Journal of Selected Topics in Quantum Electronics, vol. 5, 1999, No. 3, pp. 832–838.

* cited by examiner

Primary Examiner—Don B Wong
Assistant Examiner—Dung T Nguyen
(74) Attorney, Agent, or Firm—Sughrue Mion, PLLC

(57) ABSTRACT

In a semiconductor laser element, a lower cladding layer of a first conductive type, a lower optical waveguide layer of the first conductive type or an undoped type, a lower GaAs layer, a compressive-strain quantum well active layer, and an upper GaAs layer are formed on a GaAs substrate of the first conductive type. The upper GaAs layer, the active layer, and the lower GaAs layer are partially removed in a vicinity of end facets of a resonator, and the space of the vicinity of end facets is filled with an upper optical waveguide layer of a second conductive type or an undoped type, an upper cladding layer of the second conductive type, and a GaAs contact layer of the second conductive type. Thus a window structure is formed in the vicinity of the end facets.

28 Claims, 6 Drawing Sheets

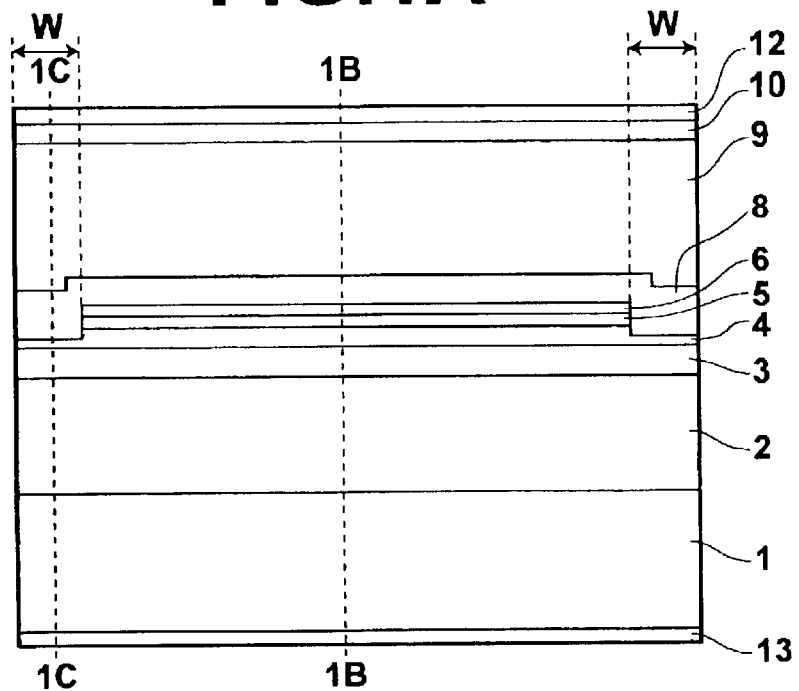
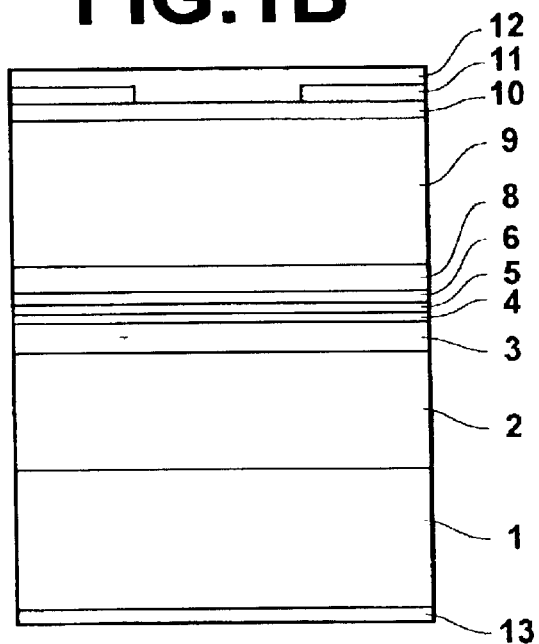
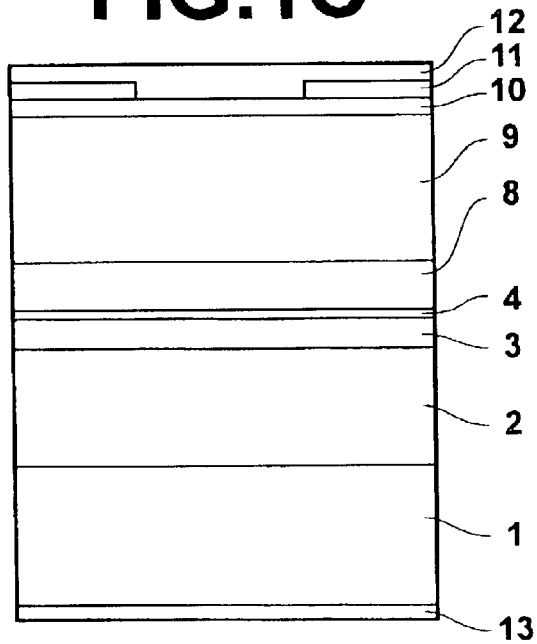

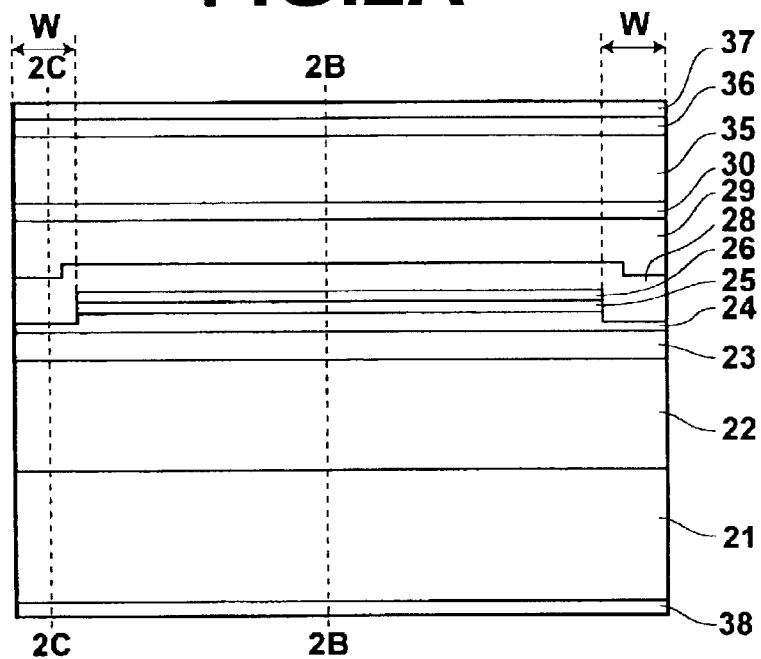
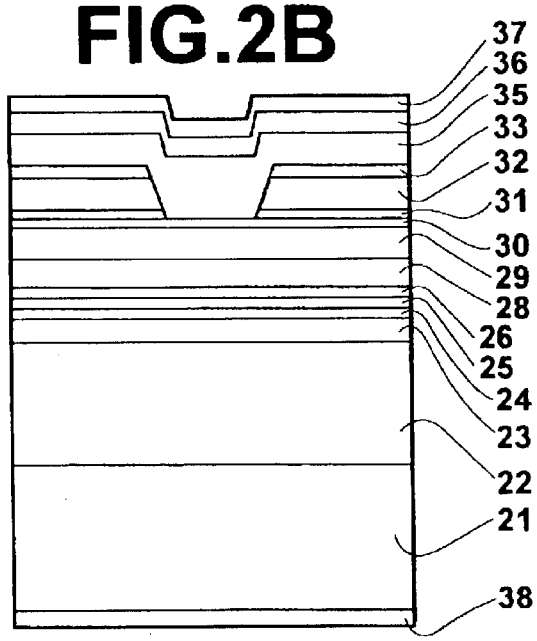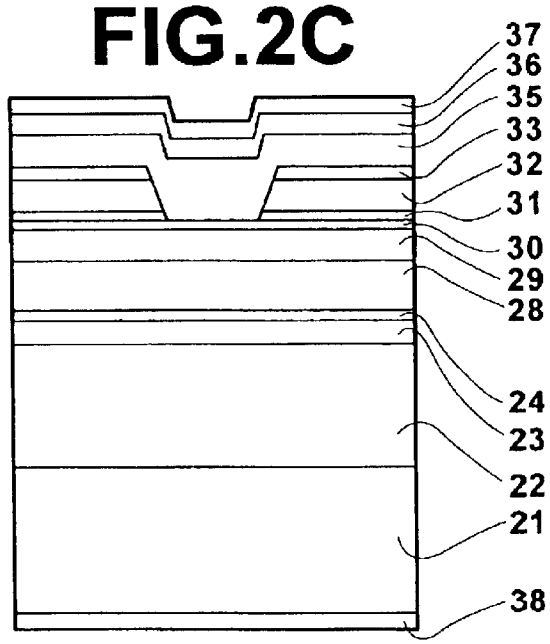

SEMICONDUCTOR LASER ELEMENT

BACKGROUND OF THE INVENTION

1. Field of the Invention

The present invention relates to a semiconductor laser element having an optically-nonabsorbent window structure at the end facets.

2. Description of the Related Art

Maximum optical output power of semiconductor laser elements is known to be limited by catastrophic optical mirror damage (COMD), wherein end facets are damaged by a cycle in which currents generated by optical absorption at the end facets raise the temperature at the end facets, the raised temperature reduces the semiconductor bandgaps at the end facets, and therefore the optical absorption is further enhanced. The optical output power level, at which the COMD occurs (COMD level), decreases with degradation of the end facet caused by aging. In addition, there are cases in which the semiconductor laser suddenly shuts down. Accordingly, high output power and high reliability are known to be obtained by forming an optically-nonabsorbent window structure at the end facet of semiconductor laser element.

Kazushige Kawasaki et al. ("0.98 µm band ridge-type window structure semiconductor laser (1)," Abstracts of the Spring Meeting of the Japan Society of Applied Physics, 1997, 29a-PA-19) disclose a semiconductor laser element which emits laser light in the 980 nm band and has a window structure at its end facets. The window structure is formed by injecting Si ions into near-edge regions of a ridge structure and disordering an $In_{0.2}Ga_{0.8}As$ quantum well by thermal diffusion.

H. Horie et al. (in "Reliability improvement of 980-nm laser diodes with a new facet passivation process", IEEE Journal of Selected Topics in Quantum Electronics, Vol. 5 (1999), No. 3, pp. 832–838) disclose a semiconductor laser element having an internal current confinement structure. The semiconductor laser element comprises an InGaAs active layer, GaAs optical waveguide layers, AlGaAs cladding layers, and an AlGaAs current confinement layer. In addition, cleaved end facets are irradiated with Ar ions having energy not higher than 35 eV, and coated with silicon by vapor deposition. Then, AR/HR coatings are administered on the end facets by an ion assist vapor deposition method, where the average acceleration voltage for Ar ions is 110 eV. Thus, this semiconductor laser element can achieve high output power and reliability. Further, Horie et al. report that since the upper and lower optical waveguide of the semiconductor laser element are formed by GaAs, the crystal quality is maintained even if the temperature is raised and lowered during GaAs growth, and since InGaAs of the active layer can be grown in low temperatures, the crystal quality can be improved.

However, in the former report, there is a drawback that a process for injecting Si ion in the vicinities of the active layer is required and the fabrication process becomes longer. In addition, since a diffusion process is required, obtaining an accurate window structure is difficult. In the latter report, the low-energy ion acceleration requires expensive equipment, and the cost increases.

SUMMARY OF THE INVENTION

The present invention has been developed in view of the above circumstances. The object of the present invention is to provide a semiconductor laser element which is reliable in operation from low to high output power, having an optically-nonabsorbent window structure at its end facets.

According to the present invention, there is provided a semiconductor laser element having optical waveguide layers whose bandgap energies are greater than a bandgap energy of an active layer, comprising: a substrate of GaAs of a first conductive type; a lower cladding layer of the first conductive type, formed above the GaAs substrate; a lower optical waveguide layer of the first conductive type or an undoped type, formed above the lower cladding layer; a lower GaAs layer formed above the lower optical waveguide layer; an active layer of $In_{x1}Ga_{1-x1}As_{1-y1}P_{y1}$ (0.49y1<x1≦0.4, 0≦y1≦0.1), formed above the lower GaAs layer; an upper GaAs layer formed above the active layer; an upper optical waveguide layer of a second conductive type or an undoped type, formed above the upper GaAs layer; an upper cladding layer of the second conductive type formed above the upper GaAs layer; and a contact layer of the second conductive type being formed above the upper cladding layer; wherein:

at least the upper GaAs and the active layer among the lower GaAs Layer, the active layer, and the upper GaAs layer, are formed in regions except at least a vicinity of one emission end facet of a resonator, and the upper optical waveguide layer is formed so that the end portions thereof bury the vicinity of the emission end facet.

Note that at the two end facets of the resonator, the vicinity of the end facets may be removed.

The contact layer of the second conductive type can be formed in a region except the vicinity of the end facets, and in this case, it is desirable that an insulative film having an opening for current injection is formed from the upper surface of the upper cladding layer of the second conductive type to the upper surface of the contact layer of the second conductive type, and an electrode is formed at least on the opening mentioned above. That is, the electrode may be formed on apart of the insulative film corresponding to the contact layer of the second conductive type, or on the entirety of the insulative film, so as to cover the opening.

A GaAs layer with a thickness of approximately 20 nm may be formed under the upper optical waveguide layer.

A semiconductor laser element according to the present invention may have a refractive index waveguide mechanism formed by a ridge structure. In addition, a semiconductor laser element according to the present invention may have a refractive index waveguide mechanism formed by an internal current confinement structure.

A semiconductor laser element according to the present invention may have a first etching block layer of the second conductive type of $In_{x9}Ga_{1-x9}P$ (0≦x9≦1), a second GaAs etching block layer, a current confinement layer of the first conductive type of $In_{0.5}(Ga_{1-z4}Al_{z4})_{0.5}P$ (0≦z4≦1), and a cap layer of an InGaP family crystal, lattice matched to GaAs, are formed in this order on the upper optical waveguide layer. There may be provided an opening with a width from approximately 1 µm to approximately 4 µm between the two facets of the resonator in the cap layer, the current confinement layer and the second etching block layer, and the upper cladding layer of the second conductive type and the contact layer of the second conductive type may be provided so as to bury the opening. Note that there may be another upper cladding layer made of the second conductive type $Al_{z1}Ga_{1-z1}As$ (0.25≦z1≦0.8) between the upper optical waveguide layer and the first etching block layer.

In addition, in a semiconductor laser element according to the present invention, the upper cladding layer of the second conductive type may be made of a first upper cladding layer of the second conductive type and a second upper cladding layer of the second conductive type. The first upper cladding layer of the second conductive type of $Al_{z1}Ga_{1-z1}As$ ($0.25 \leq z1 \leq 0.8$), first etching block layer of the second conductive type of GaAs, a second etching block layer being made of $In_{x8}Ga_{1-x8}P$ ($0 \leq x8 \leq 1$), a current confinement layer of the first conductive type being made of $Al_{z3}Ga_{1-z3}As$ ($z1 \leq z3 \leq 0.8$) and a GaAs cap layer may be formed above the upper optical waveguide layer in this order. An opening of from about 1 μm to about 4 μm width may be provided between the two facets of the resonator in the cap layer, the current confinement layer and the second etching block layer, and said opening may be filled in by the second upper cladding layer of the second conductive type with the contact layer of the second conductive type formed above the cladding layer.

In addition, in a semiconductor laser element according to the present invention, the upper cladding layer of the second conductive type may be made of a first upper cladding layer of the second conductive type and a second upper cladding layer of the second conductive type. The first upper cladding layer of the second conductive type of an InGaP family crystal, lattice matched to GaAs, a GaAs etching block layer, a current confinement layer of the first conductive type of $In_{0.5}(Ga_{1-z4}Al_{z4})_{0.5}P$, and a cap layer made of an InGaP family crystal, lattice matched to GaAs may be formed above the upper optical waveguide layer in this order. An opening of from about 1 μm to about 4 μm width may be provided between the two facet of the resonator in the cap layer, the current confinement layer and the second etching block layer, and said opening may be filled in by the second upper cladding layer of the second conductive type with the contact layer of the second conductive type formed above the cladding layer.

Note that the "InGaP family" is made of three elements; In, Ga, and P, where composition ratio of In and Ga is different.

Preferably, the optical waveguide layers are made of $Al_{z2}Ga_{1-z2}As$ ($0 < z2 < 0.8$) or $In_{x2}Ga_{1-x2}As_{1-y2}P_{y2}$ ($0 < y2 \leq 1$, $x2 = 0.49y2$), lattice matched to GaAs. It is desirable that compositions are adopted so that the bandgap of the optical waveguide layer is greater than the bandgap of GaAs and smaller than the bandgaps of the cladding layers, and the refractive index of the optical waveguide layer is smaller than the refractive index of GaAs and greater than the refractive indices of the cladding layers.

A barrier layer of $In_{x4}Ga_{1-x4}As_{1-y4}P_{y4}$ ($0 \leq x4 < 0.49y4$, $0 < y4 \leq 0.6$), having tensile-strain and a greater bandgap energy than a bandgap energy of the active layer, may be formed adjacent to the active layer.

In addition, the cladding layer is of a composition that lattice matches with the substrate.

Defining $C_{GaAs}$ as the lattice constant of GaAs, ca as the lattice constant of an active layer, the strain amount of an active layer $\Delta a$ is expressed as $\Delta a = (ca - C_{GaAs})/C_{GaAs}$. Defining cb as a lattice constant of a tensile-strain barrier layer, a strain amount of a tensile-strain layer $\Delta b$ is expressed as $\Delta b = (cb - C_{GaAs})/C_{GaAs}$. Further, defining da as a thickness of an active layer, db as a one-side thickness of a barrier layer, a layer composition of 0.25 nm $\geq \Delta a da + 2\Delta b db \geq -0.25$ nm which does not spoil the crystallinity of the active area is preferable.

In addition, defining the lattice constant of a growing layer as c, lattice matching to GaAs means that an absolute value of a strain amount $\Delta$ is less than 0.005 where $\Delta = (c - C_{GaAs})/C_{GaAs}$.

The first conductive type and the second conductive type have reversed polarities from each other. For example, if the first conductive type is p-type, the second conductive type is n-type.

Said "vicinity of end facet" is preferably a region of a depth of about 5 μm to about 50 μm towards the interior of the element from the end facet. If the depth is less than 5 μm, an optically-nonabsorbent region can not practically be formed because of current spread, and is not preferable due to degradation of facets occurring because of heat. If the depth is greater than 50 μm, the optical output power is undesirably reduced because of the optical loss.

According to the laser element of the present invention, optical absorption in the end facets can be eliminated even when the temperature of the end facets is increased under high output power, since the above mentioned window structure exists and the upper optical waveguide layer that has a greater bandgap energy than a bandgap energy of the active layer is filled in the vicinity of the end facets. Therefore, current caused by an optical absorption can be prevented and a heat generation at the end facets can be reduced. Thus, a significant improvement in the COMD level is obtained, and high reliability under high output oscillation can be obtained.

In the present invention, the active layer can be formed at low temperatures since GaAs layers are formed both above and below the active layer and GaAs can be grown in varying temperature conditions. Thus a high quality crystal can be obtained.

The refractive index waveguide layer can be formed accurately to the end facet because layers are flatly formed in the vicinity of the end facet in the same manner as the inside of the resonator.

The contact layer of the second conductive type is formed in regions except the vicinity of the end facet, and an insulative layer having an opening to inject current is formed at the region in the vicinity of the emission end facets from above the upper cladding layer of the second conductive type to above said contact layer of the second conductive type, and an electrode is formed at least on the opening. That is, in the vicinity of the end facets, the current injection is restricted because there is no layer that can have an ohmic contact with the electrode, thus an optical density can be reduced at the end facets. Therefore, it is possible to reduce heat generation in the vicinity of the end facets, and significantly raise the COMD level caused by thermo runaway. Consequently, reliability of the semiconductor laser element in high output power operations can be enhanced.

It is preferable to apply the present invention to a semiconductor laser element with a refractive index waveguide mechanism formed by a ridge structure, because a high quality oscillation light can be obtained up to high output power.

It is also preferable to apply the present invention to a semiconductor laser element with a refractive index waveguide mechanism formed by an internal current confinement structure because a high quality oscillation light can be obtained up to high output power.

Electric characteristics such as a threshold current and reliability can be improved by having a tensile-strain barrier layer because strain compensation is performed in the active layer.

BRIEF DESCRIPTION OF THE DRAWINGS

FIGS. 1A, 1B, and 1C are cross-sectional views of a semiconductor laser element according to a first embodiment of the present invention.

FIGS. 2A, 2B, and 2C are cross-sectional views of a semiconductor laser element according to a second embodiment of the present invention.

DESCRIPTION OF THE PREFERRED EMBODIMENTS

Figure 3A:
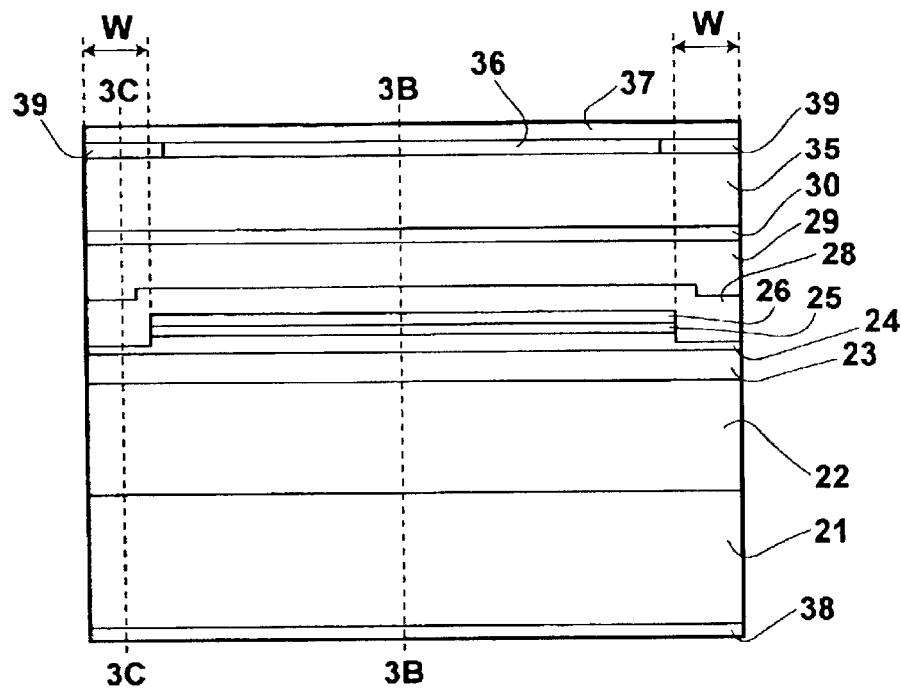
FIGS. 3A, 3B, and 3C are cross-sectional views of a semiconductor laser element according to a third embodiment of the present invention.

Embodiments of the present invention will be explained in detail below with reference to the attached figures.

First Embodiment

The first embodiment of the present invention will be described along a fabrication process thereof. FIG. 1A shows a cross sectional view parallel to the laser oscillation direction and perpendicular to the thickness direction, and FIGS. 1B and 1C respectively show cross sectional view along the 1B—1B and 1C—1C lines indicated in FIG. 1A.

As shown in FIG. 1A, an n-type $Al_{z1}Ga_{1-z1}As$ lower cladding layer 2 ($0.25 \leq z1 \leq 0.8$), an n-type or i-type $Al_{z2}Ga_{1-z2}As$ lower optical waveguide 3 ($0<z2<z1$), a lower GaAs layer 4, an $In_{x3}Ga_{1-x3}As_{1-y3}P_{y3}$ compressive-strain quantum well active layer 5 ($0.49y3<x3\leq 0.4$, $0\leq y3\leq 0.1$), an upper GaAs layer 6 (thickness of about 30 nm), an $In_{0.49}Ga_{0.51}P$ cap layer (not shown, thickness of about 20 nm) are formed in this order on an n-type GaAs (100) substrate 1 by an organic metal vapor phase epitaxy method. A photoresist is coated. Then, a part of the photoresist centering around an intended position of cleaving by a width of 40 μm (that is, 20 μm towards the interior of the resonator from one facet of the resonator) is removed in a stripe shape in the direction of <0$\bar{1}$1> by an ordinary photolithography method. The $In_{0.49}Ga_{0.51}P$ cap layer is etched by hydrochloric acid using the resist mentioned above as a mask, thus the upper GaAs layer 6 is exposed and a groove stripe is formed. At this time the etching is automatically stopped at the upper GaAs layer 6. In succession, after removing the resist, a slow etching solution of the sulfuric acid family ($H_2SO_4:H_2O_2:H_2O=4:1:90$) etches until a part of the lower GaAs layer 4 is removed. At this time the lower GaAs layer 4 may be etched until the lower optical waveguide is exposed.

Thereafter, the $In_{0.49}Ga_{0.51}P$ cap layer is removed by a hydro chloric acid family solution. Then, a p-type or i-type $Al_{z2}Ga_{1-z2}As$ upper optical waveguide layer 8, a p-type $Al_{z1}Ga_{1-z1}As$ upper cladding layer 9 and a p-type GaAs contact layer 10 are formed. An insulative layer 11 is formed above the contact layer, and an opening of current injection is formed in the <011> direction and with a width of from 1 μm to 4 μm in a stripe-shape by an ordinary photolithographic method. Further, a p-side electrode 12 is vapor deposited, the substrate is ground, and an n-side electrode 13 is formed. The material made by the above-mentioned methods is cleaved, and one of the cleaved facets of the resonator is coated with a high reflectance film and the other facet is coated with a low reflectance film, and finally is formed as a chip in a die to complete the semiconductor laser element.

In the semiconductor laser element according to the first embodiment, as shown in FIG. 1B, the lower GaAs layer 4, the upper GaAs layer 6, and the active layer 5 are not removed towards the interior of the vicinity of the resonator end facets, and in the vicinity of the resonator end facets, as shown in FIG. 1C, a part of the lower GaAs layer 4, the active layer 5 and the upper GaAs layer 6 are removed and the spaces produced by the absence of the lower GaAs layer, the active layer and the upper GaAs layer are filled with the upper optical waveguide layer 8.

Since the lower GaAs layer 4 is removed partially, a re-growth interface is in the midst of the lower GaAs layer 4. The interface is apart from the quantum well active layer 5, thus carriers leaked from the active layer 5 and diffused can not be combined at the re-growth interface. Therefore, reduction of efficiency by the combination or degradation of the end facets caused by heat can be prevented.

The cladding layer is made of a material that has a greater bandgap energy than a bandgap energy of the optical waveguide layer and may be a crystal of either the InGaAlP or InGaAlAsP families.

In the contact layer 10 of p-GaAs, a corresponding region to a region where the active layer 5 is removed may be selectively removed by a mixed solution of $NH_4OH$ aqueous solution and hydrogen peroxide. Further, the p-side electrode 12 may be formed only in a region corresponding to the p-GaAs contact layer 10.

The optical waveguide layer may be an $In_{x2}Ga_{1-x2}As_{1-y2}P_{y2}$ ($0<y2\leq 1$, $x2=0.49y2$) lattice matched to GaAs, having a greater refractive index than a refractive index of the cladding layer at an oscillating wavelength and a smaller bandgap energy than a bandgap energy of the cladding layer.

Note that a GaAs layer of about 20 nm thickness may be formed before growing the p-type or i-type $Al_{z2}Ga_{1-z2}As$ upper optical waveguide layer 8. The quality of crystal at the re-growth interface can be improved by once forming GaAs, and after that re-growing AlGaAs, compared with re-growing AlGaAs directly.

Second Embodiment

A semiconductor laser element according to the second embodiment of the present invention will be explained. FIG. 2A shows a cross sectional view of a light-emitting region of the semiconductor element, and FIG. 2B shows a cross sectional view taking along the line 2B—2B in FIG. 2A, and FIG. 2C shows a cross sectional view taking along the line 2C—2C in FIG. 2A.

As shown in FIG. 2A and FIG. 2B, an n-type $Al_{z1}Ga_{1-z1}As$ lower cladding layer 22 ($0.25\leq z1\leq 0.8$), an n-type or i-type $Al_{z2}Ga_{1-z2}As$ lower optical waveguide 23 ($0<z2<z1$), a lower GaAs layer 24, an $In_{x3}Ga_{1-x3}As_{1-y3}P_{y3}$ compressive-strain quantum well active layer 25 ($0.49y3<x3\leq 0.4$, $0\leq y3\leq 0.1$), an upper GaAs layer 26 (thickness of about 30 nm), an $In_{0.49}Ga_{0.51}P$ cap layer (thickness of about 20 nm) are formed in this order on n-GaAs (100) substrate 21 by an organic metal vapor phase epitaxy method. A photoresist is coated. Then, a region of the photoresist centering around a intended position of cleaving by a width of 40 μm (that is, 20 μm towards the interior of the resonator from one facet of the resonator) is removed by a stripe shape in the direction of <0$\bar{1}$1> by an ordinary photolithography method. The $In_{0.49}Ga_{0.51}P$ cap layer is etched by hydrochloric acid using the resist mentioned above as a mask, thus the upper GaAs layer 26 is exposed and a groove stripe is formed. At this time the etching is automatically stopped at the upper GaAs layer 26. In succession, after removing the resist, a slow etching solution of the sulfuric acid family ($H_2SO_4$:$H_2O_2$:$H_2O$=4:1:90) etches until a part of the lower GaAs layer 24 is removed. At this time the lower GaAs layer 24 may be etched until the lower optical waveguide 23 is exposed. Thereafter, the $In_{0.49}Ga_{0.51}P$ cap layer is removed by a hydro chloric acid family solution.

Next, a p-type or i-type $Al_{z2}Ga_{1-z2}As$ upper optical waveguide layer 28, a p-type $Al_{z1}Ga_{1-z1}As$ first upper cladding layer 29, a p-type GaAs first etching block layer 30, an $In_{x8}Ga_{1-x8}P$ second etching block layer 31 ($0 \leq x8 \leq 1$), an n-type $Al_{z3}Ga_{1-z3}As$ current confinement layer 32 ($z1 < Z3 \leq 0.8$), a GaAs first cap layer 33, and an $In_{0.49}Ga_{0.51}P$ second cap layer (not shown) are formed in this order. A photoresist is coated. Then, a part of the photoresist with a width of 1 to 4 μm in the direction of <011> perpendicular to the above-mentioned stripe is removed, using the resist as a mask, the second $In_{0.49}Ga_{0.51}P$ cap layer is removed in a stripe shape by a hydro chloric acid family solution. At this time, the etching is automatically stopped at the first cap layer 33. After removing the photoresist, the first GaAs cap layer 33 and the n-type $Al_{z3}Ga_{1-z3}As$ current confinement layer 32 are removed by mixed solution of sulfuric acid, hydrogen peroxide solution and water using the second $In_{0.49}Ga_{0.51}P$ cap layer as a mask. In succession, the remaining second $In_{0.49}Ga_{0.51}P$ cap layer and the exposed second $In_{x8}Ga_{1-x8}P$ etching block layer 31 are removed by a hydro chloric acid family etching solution.

Next, a p-type $Al_{z1}Ga_{1-z1}As$ upper second cladding layer 35 and a p-type GaAs contact layer 36 are grown. Then a p-side electrode 37 is formed, and an n-side electrode 38 is formed by grinding the substrate. The material made by the above-mentioned methods is cleaved, and one of the cleaved facets of the resonator is coated with a high reflectance film and the other facet is coated with a low reflectance film, and finally is formed as a chip in a die to complete the semiconductor laser element.

The thickness of the upper optical waveguide layer 28, the thickness and the composition of the upper first cladding layer 29, and the composition of the upper second cladding layer 35 are arranged so as to realize high output power in a fundamental transverse mode oscillation. That is, an equivalent refractive index step is set to be between $1.5 \times 10^{-3}$ and $7 \times 10^{-3}$. Even in the case that the upper first cladding layer 29 is not provided, the equivalent refractive index step can be between $1.5 \times 10^{-3}$ and $7 \times 10^{-3}$.

The upper first cladding layer 29 may be made of $In_{0.49}Ga_{0.51}P$.

In the semiconductor laser element according to the present invention, as shown in FIG. 2B, the lower GaAs layer 24, the upper GaAs layer 26 and the active layer are not removed from the interior of the resonator, and in the vicinity of the resonator end facets, as shown in FIG. 2C, the active layer 25 and the upper GaAs layer are removed whereas a part of the lower GaAs layer 24 remains. The upper optical waveguide layer 28 is buried so as to fill in the removed area of the layers mentioned above, and there is provided a refractive index waveguide mechanism formed by the internal current confinement structure.

Third Embodiment

Figure 3B:
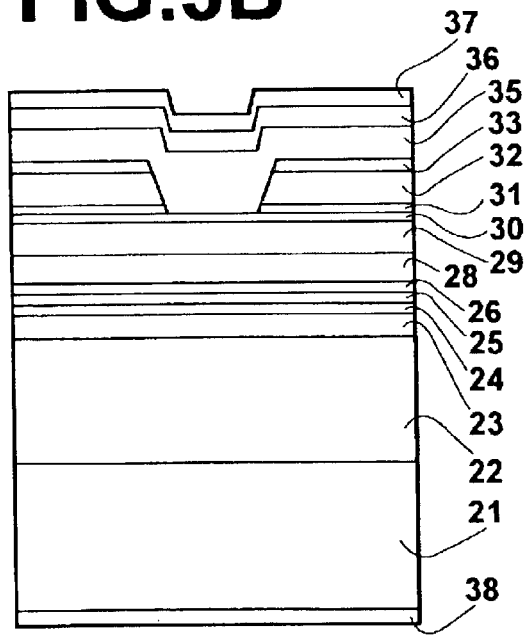
Figure 3C:
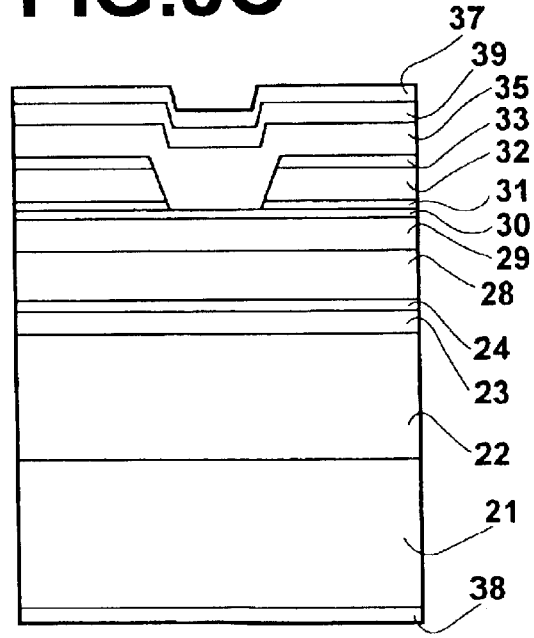

Next, a semiconductor laser element according to a third embodiment of the present invention will be explained. A cross-sectional view of the semiconductor laser element is shown in FIG. 3. The same items as in the above-mentioned second embodiment of a semiconductor laser element have the same reference numbers assigned thereto, and explanations for them are omitted.

The semiconductor laser element according to the present embodiment is the semiconductor laser element according to the second embodiment, wherein the p-type GaAs contact layer 36 corresponding to the removed region of the active layer 25 is selectively removed by an $NH_4OH$ solution and a hydrogen peroxide solution, and is covered with the insulative film 39, and the p-side electrode 37 is formed above the p-type GaAs contact layer. The semiconductor laser element according to the present embodiment can reduce current injection to window area substantially, can reduce end facet optical density, and can reduce heat generation at the end facets.

Fourth Embodiment

Figure 4A:
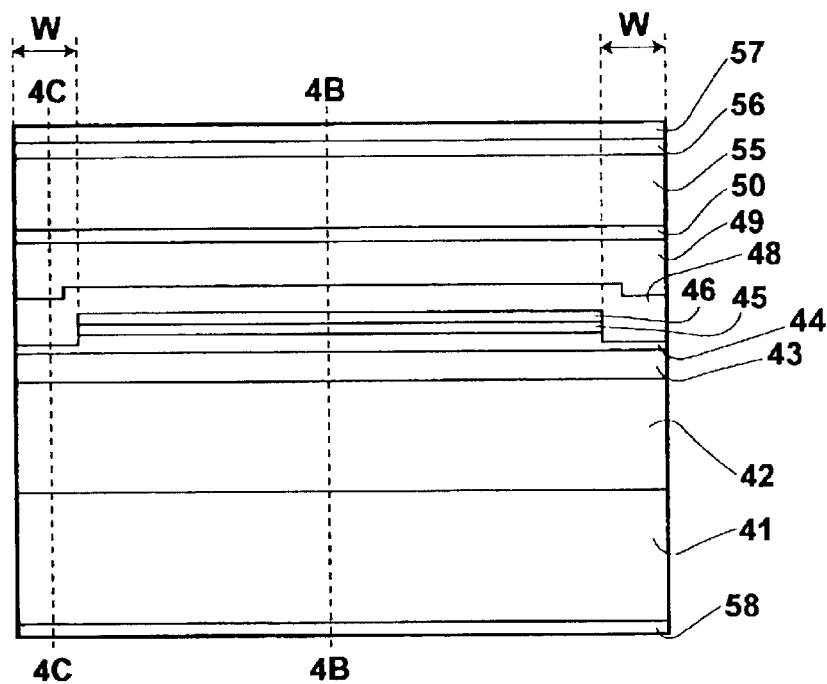
FIGS. 4A, 4B, and 4C are cross-sectional views of a semiconductor laser element according to a fourth embodiment of the present invention.
Figure 4B:
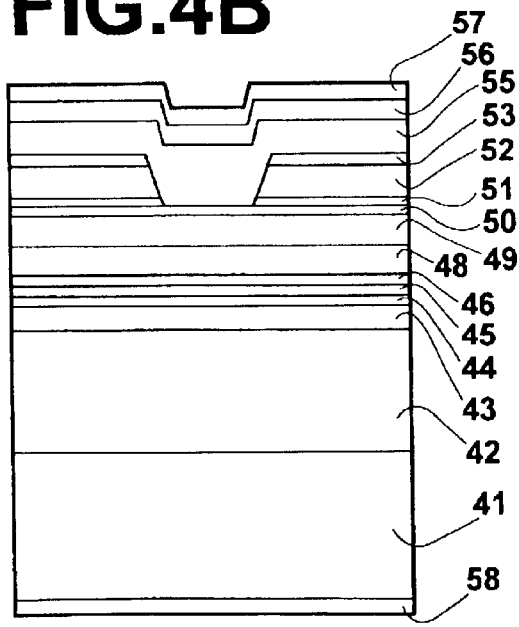
Figure 4C:
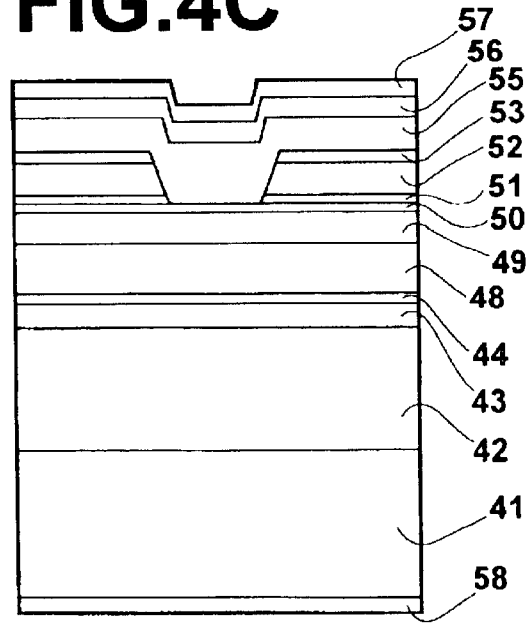

Next, a semiconductor laser element according to a fourth embodiment will be explained. The cross-sectional view of a light emitting region of the semiconductor laser element is shown in FIG. 4A. A cross sectional view taken along the line 4B—4B of FIG. 4A is shown in FIG. 4B. A cross sectional view taken along the line 4C—4C of FIG. 4A is shown in FIG. 4C.

As shown in FIG. 4A and FIG. 4B, an n-type $Al_{z1}Ga_{1-z1}As$ lower cladding layer 42 ($0.45 \leq z1 \leq 0.8$), an n-type or i-type $Al_{z2}Ga_{1-z2}As$ lower waveguide layer 43 ($0 < z2 < z1$), a lower i-type GaAs layer 44, an $In_{x3}Ga_{1-x3}As_{1-y3}P_{y3}$ compressive-strain quantum well active layer 45 ($0.49y3 < x3 \leq 0.4$, $0 \leq y3 \leq 0.1$), an upper i-type GaAs layer (thickness of about 30 nm) 46, and an $In_{0.49}Ga_{0.51}P$ cap layer (thickness of 20 nm, not shown) are formed in this order on an n-type GaAs (100) substrate by an organic metal vapor phase epitaxy method. After depositing photoresist, a region of the photoresist centering around an intended position of cleaving by width of 40 μm (That is, 20 μm towards the interior of the resonator from one facet of the resonator) is removed by a stripe shape in the direction of <0$\bar{1}$1> by an ordinary photolithography method. The $In_{0.49}Ga_{0.51}P$ cap layer is etched by hydrochloric acid using the resist mentioned above as a mask, thus the upper GaAs layer 26 is exposed and a groove stripe is formed. At this time the etching is automatically stopped at the upper GaAs layer 46. In succession, after removing the resist, a slow etching solution of the sulfuric acid family ($H_2SO_4$:$H_2O_2$:$H_2O$=4:1:90) etches until a portion of the lower i-type GaAs layer 44 is removed. At this time the lower i-type GaAs layer 44 may be etched until the lower optical waveguide 43 is exposed.

In succession, after the $In_{0.49}Ga_{0.51}P$ cap layer is removed by a hydro chloric acid family solution, a p-type or i-type $Al_{z2}Ga_{1-z2}As$ upper optical waveguide layer 48, a p-type $Al_{z1}Ga_{1-z1}As$ upper first cladding layer 49, a p-type $In_{x8}Ga_{1-x8}P$ first etching block layer ($0 \leq x8 \leq 1$) 50, a GaAs second etching block layer 51, an n-type $In_{0.49}(Ga_{1-z4}Al_{z4})_{0.51}P$ current confinement layer ($0 \leq z4 \leq 1$) 52, an $In_{0.49}Ga_{0.51}P$ first cap layer 53, a GaAs second cap layer (not shown) are formed in this order. After depositing photoresist, a region of photoresist with 1 to 4 μm width is removed in the direction of <011> perpendicular to said groove stripe, the GaAs second cap layer is removed in a stripe shape by a mixed solution of sulfuric acid, hydrogen peroxide and water using the photoresist as a mask. At this time, the etching is stopped automatically at the $In_{0.49}Ga_{0.51}P$ first cap layer. After removing photoresist, using the second GaAs cap layer as a mask, the first $In_{0.49}Ga_{0.51}P$ cap layer and n-type $In_{0.49}(Ga_{1-z4}Al_{z4})_{0.51}P$ current confinement layer 52 are removed by a hydro chloric acid solution, then the remaining second GaAs cap layer and the exposed second GaAs etching block layer are removed by a mixed solution of sulfuric acid, hydrogen peroxide and water.

Next, a p-type $Al_{z1}Ga_{1-z1}As$ upper second cladding layer 55 and a p-type GaAs contact layer 56 are formed. Then, a p-side electrode 57 is formed, then by grinding the substrate, an n-side electrode 58 are formed. Finally, the semiconductor laser element is completed by being formed as a chip in a die.

The thickness of the upper optical waveguide layer 48, the thickness and the composition of the upper first cladding layer 49, and the composition of the upper second cladding layer 55 are arranged so as to realize high output power in fundamental transverse mode oscillation. That is, an equivalent refractive index step is set to be between $1.5 \times 10^{-3}$ and $7 \times 10^{-3}$. Even in the case that the upper first cladding layer is not provided, the equivalent refractive index step can be the same as that mentioned above.

The semiconductor laser element according to the present embodiment, as shown in FIG. 4B, the active layer and the upper GaAs layer are not removed in the internal region inside the vicinity of the resonator end facets, the lower GaAs layer. In the vicinity of the resonator end facets, as shown in FIG. 4C, a part of the lower GaAs layer, active layer and the upper GaAs layer are removed, and the upper optical wave guide layer is buried so as to fill in the removed region.

Fifth Embodiment

Figure 5A:
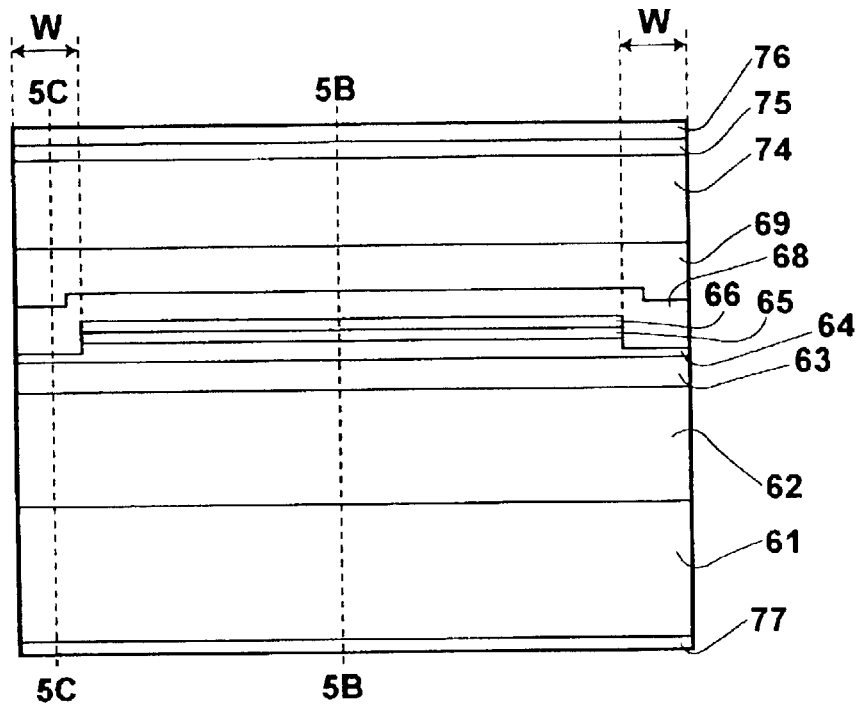
FIGS. 5A, 5B, and 5C are cross-sectional views of a semiconductor laser element according to a fifth embodiment of the present invention.

Next, a semiconductor laser element according to a fifth embodiment of the present invention will be explained. FIG. 5A shows a cross sectional view of a light emitting region of the semiconductor laser element, FIG. 5B shows a cross sectional view taken along the line 5B—5B of FIG. 5A, and FIG. 5C shows a cross sectional view taking along the line 5C—5C of FIG. 5A.

Figure 5B:
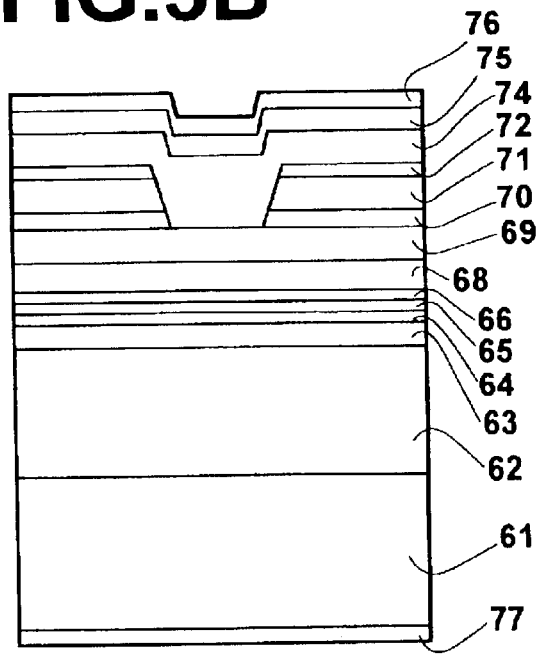
Figure 5C:
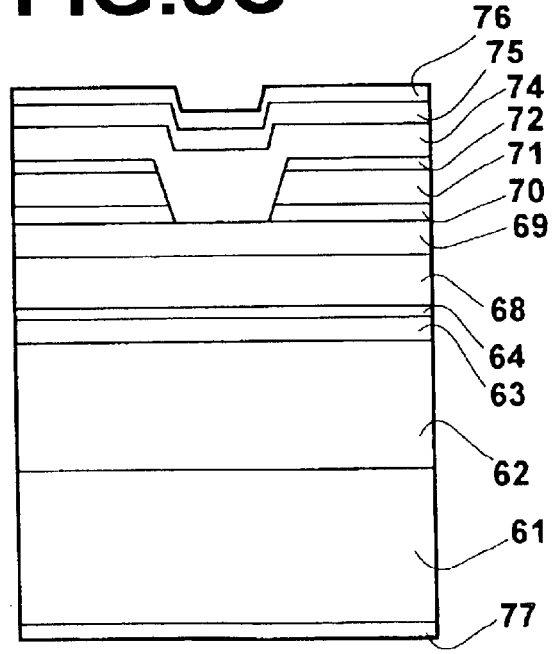

As shown in FIG. 5A and FIG. 5B, an n-type $Al_{z1}Ga_{1-z1}As$ lower cladding layer 62 ($0.45 \leq z1 \leq 0.8$), an n-type or i-type $Al_{z2}Ga_{1-z2}As$ lower optical waveguide layer 63 ($0<z2<z1$), a lower n-type or i-type GaAs layer 64, an $In_{x3}Ga_{1-x3}As_{1-y3}P_{y3}$ compressive-strain quantum well active layer 65 ($0.49y3<x3\leq 0.4$, $0\leq y3 \leq 0.1$), an upper p-type or i-type GaAs layer (thickness of about 30 nm) 66, and an $In_{0.49}Ga_{0.51}P$ cap layer (thickness of 20 nm, not shown) are formed in this order on an n-type GaAs (100) substrate 61 by an organic metal vapor phase epitaxy method. After depositing photoresist, a region of the photoresist centering around an intended position of cleaving by width of 40 μm (that is, 20 μm towards the interior of the resonator from one facet of the resonator) is removed by a stripe shape in the direction of <0$\bar{1}$1> by an ordinary photolithography method. The $In_{0.49}Ga_{0.51}P$ cap layer is etched by hydrochloric acid using the resist mentioned above as a mask, thus the upper p-type or i-type GaAs layer 66 is exposed and a groove stripe is formed. At this time the etching is automatically stopped at the upper p-type or i-type GaAs layer 66. After removing the photoresist, a slow etching solution of the sulfuric acid family ($H_2SO_4:H_2O_2:H_2O=4:1:90$) etches until the lower n-type or i-type GaAs layer 44 is exposed. At this time a part of the lower GaAs layer 64 may be etched.

Thereafter, the $In_{0.49}Ga_{0.51}P$ cap layer is removed by hydro chloric acid family etching solution. Then, a p-type or i-type $Al_{z2}Ga_{1-z2}As$ upper optical waveguide layer 68, a p-type $In_{0.49}Ga_{0.51}P$ upper first cladding layer 69, a GaAs etching block layer 70, an n-type $In_{0.49}(Ga_{1-z4}Al_{z4})_{0.51}P$ current confinement layer ($0 \leq z4 \leq 1$) 71, an $In_{0.49}Ga_{0.51}P$ first cap layer 72, a GaAs second cap layer (not shown) are formed in this order. After depositing photoresist, a region of photoresist with 1 to 4 μm width is removed in the direction of <011> perpendicular to said stripe. The GaAs second cap layer is removed in a stripe shape by a mixed solution of sulfuric acid, hydrogen peroxide and water using the photoresist as a mask. At this time, the etching is stopped automatically at the $In_{0.49}Ga_{0.51}P$ first cap layer 72. After removing the photoresist, using the second GaAs cap layer as a mask, the first $In_{0.49}Ga_{0.51}P$ cap layer 72 and the n-type $In_{0.49}(Ga_{1-z4}Al_{z4})_{0.51}P$ current confinement layer 72 are removed by a hydro chloric acid family solution, then the remaining second GaAs cap layer and the exposed second GaAs etching block layer 70 are removed by a mixed solution of sulfuric acid, hydrogen peroxide and water.

Next, a p-type $Al_{z1}Ga_{1-z1}As$ upper second cladding layer 74 and a p-type GaAs contact layer 75 are grown. Then a p-side electrode 76 is formed, and an n-side electrode 77 is formed by grinding the substrate. Then the material made by the above-mentioned methods is cleaved, and one of the cleaved facets of the resonator is coated with a high reflectance film and the other facet is coated with a low reflectance film, and finally is formed as a chip in a die to complete the semiconductor laser element.

The thickness of the upper optical waveguide layer 68, the thickness and the composition of the upper first cladding layer 69, and the composition of the upper second cladding layer 74 are arranged so as to realize high output power of fundamental transverse mode oscillation. That is, an equivalent refraction index step is set to be between $1.5 \times 10^{-3}$ and $7 \times 10^{-3}$.

Sixth Embodiment

Figure 6A:
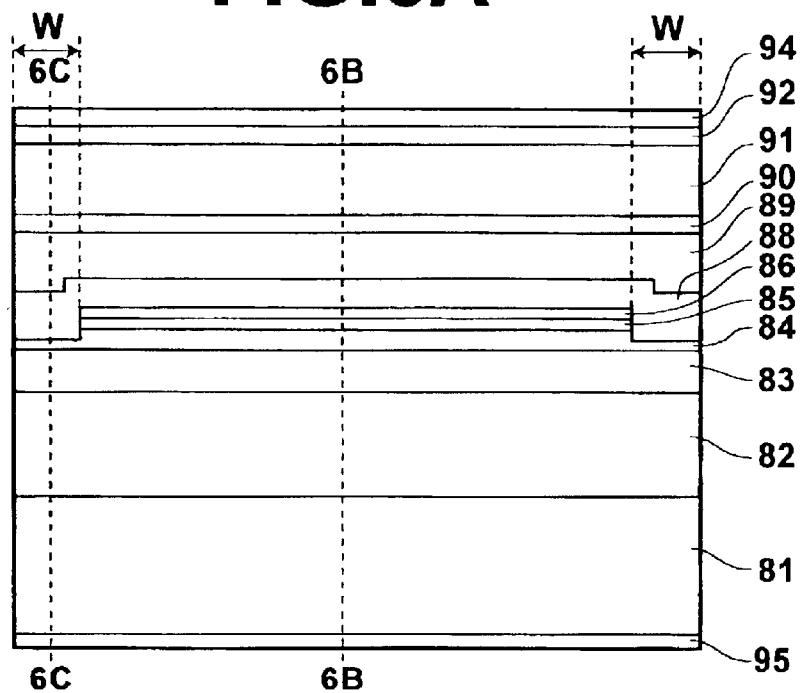
FIGS. 6A, 6B, and 6C are cross-sectional views of a semiconductor laser element according to a sixth embodiment of the present invention.

Next, a semiconductor laser element according to a sixth embodiment of the present invention will be explained. FIG. 6A shows a cross sectional view of a light emitting region of the semiconductor laser element, FIG. 6B shows a cross sectional view taken along the line 6B—6B of FIG. 6A, and FIG. 6C shows a cross sectional view taken along the line 6C—6C of FIG. 6A.

Figure 6B:
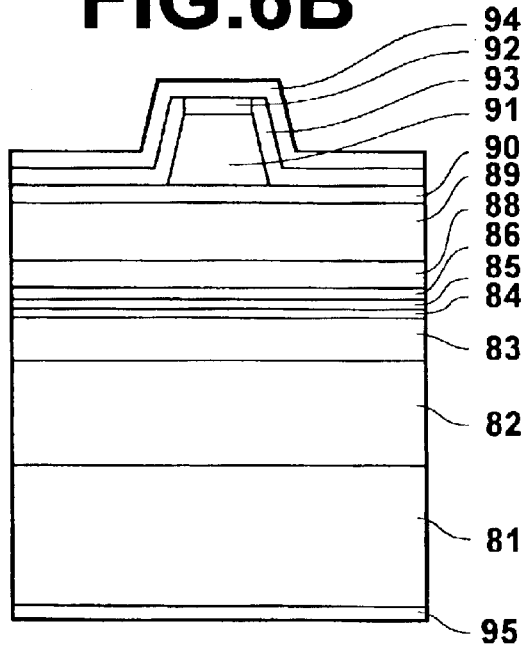
Figure 6C:
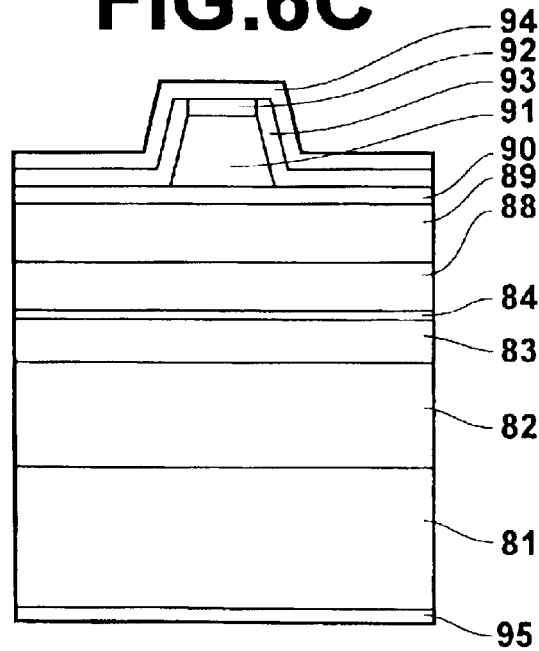

As shown in FIG. 6A and FIG. 6B, an n-type $Al_{z1}Ga_{1-z1}As$ Lower cladding layer 82 ($0.25 \leq z1 \leq 0.8$), an n-type or i-type $Al_{z2}Ga_{1-z2}As$ lower optical waveguide layer 83 ($0<z2<z1$), a lower i-type GaAs layer 84, an $In_{x3}Ga_{1-x3}As_{1-y3}P_{y3}$ compressive-strain quantum well active layer 85 ($0.49y3<x3\leq 0.4$, $0\leq y3 \leq 0.1$), an upper i-type GaAs layer (thickness of about 30 nm) 86, and an $In_{0.49}Ga_{0.51}P$ cap layer (thickness of about 20 nm) are formed in this order on an n-type GaAs (100) substrate 81 by an organic metal vapor phase epitaxy method. After depositing photoresist, a region of the photoresist centering around an intended position of cleaving by width of 40 μm (that is, 20 μm towards the interior of the resonator from one facet of the resonator) is removed by a stripe shape in the direction of <0$\bar{1}$1> by an ordinary photolithography method. The $In_{0.49}Ga_{0.51}P$ cap layer is etched by a hydrochloric acid family etching solution using the photoresist mentioned above as a mask, thus the upper i-type GaAs layer 86 is exposed and a groove stripe is formed. At this time the etching is automatically stopped at the upper i-type GaAs layer 86. After removing the photoresist, a slow etching solution of the sulfuric acid family ($H_2SO_4:H_2O_2:H_2O=4:1:90$) etches until a potion of the lower i-type GaAs layer 84 is removed. At this time the lower i-type GaAs layer 84 may be etched until the lower optical waveguide layer 83 is exposed.

Thereafter, the $In_{0.49}Ga_{0.51}P$ cap layer is removed by a hydro chloric acid family etching solution. Then, a p-type or i-type $Al_{z2}Ga_{1-z2}As$ upper optical waveguide layer 88, a p-type $Al_{z1}Ga_{1-z1}As$ upper first cladding layer 89, a p-type $In_{x8}Ga_{1-x8}P$ etching block layer 90 ($0\leq x8 \leq 1$), a p-type $Al_{z1}Ga_{1-z1}As$ upper second cladding layer 91, and a p-type GaAs contact layer 92 are grown. Next, an insulative film (not shown) is formed, and the film is removed except a stripe-shaped region with width of 1 to 4 μm in the direction of <011>. Using the insulative film as a mask, the p-type GaAs contact layer 92 and the p-type $Al_{z1}Ga_{1-z1}As$ upper second cladding layer are removed by a mixed solution of sulfuric acid, hydrogen peroxide and water. Thus a ridge is formed. After removing the insulative film, a new insulative film 93 is formed, and a current injection window is formed only on the ridge by an ordinary photolithography method. In addition, a p-side electrode 94 is formed, and then an n-side electrode 95 is formed by grinding the substrate. Then the material made by the above-mentioned methods is cleaved, and one of the cleaved facets of the resonator is coated with a high reflectance film and the other facet is coated with a low reflectance film, and finally is formed as a chip in a die to complete the semiconductor laser element.

The thickness of the upper first cladding layer is arranged so as to realize high output power in fundamental transverse mode oscillation. That is, an equivalent refractive index step is to be between $1.5\times10^{-3}$ and $7\times10^{-3}$. Even in the case that the upper first cladding layer is not provided, it is possible to set the equivalent refractive index step between $1.5\times10^{-3}$ and $7\times10^{-3}$.

A wavelength band λ of the light emitted by the semiconductor laser elements according to the all of the embodiments described above can be controlled within the range 900 nm<λ<1200 nm by adjusting the active layer composition.

In addition, as a growing method for semiconductor layers, a molecular beam epitaxy method of solid or vapor materials may be used.

Moreover, n-type conductive GaAs substrates are used in the above descriptions. However, a p-type conductive substrate may be used. In this case, all of the layers mentioned above should be of the opposite conductivity.

The active layer may be a multiple quantum well.

In order to compensate for the strain of the active layer, tensile-strain $In_{x4}Ga_{1-x4}As_{1-y4}P_{y4}$ barrier layers ($0\leq x4<0.49y4$, $0<y4\leq 0.6$) may be formed on both sides of the active layer.

The optical waveguide layer may be an $In_{x2}Ga_{1-x2}As_{1-y2}P_{y2}$ ($0<y2\leq 1$, $x2=0.49y2$) lattice matched to GaAs, having a greater refractive index in the oscillation wavelength than a refractive index of the cladding layer and smaller than a refractive index of the GaAs layer, and also having a smaller bandgap energy than a bandgap energy of the cladding layer and a greater bandgap energy than a bandgap energy of the GaAs layer.

The semiconductor laser elements according to all of the embodiments described above can generate a high level laser beam while maintaining the fundamental transverse mode oscillation. In the embodiments described above, laser elements having the fundamental transverse mode oscillation with stripe width of 1 to 4 μm have been described. However, a multi-mode oscillation refractive index waveguide type laser can be realized by making the stripe width greater than 4 μm. Even in the multi-mode, a laser oscillation with low noise can be obtained.

Further, the second etching block layer, the first cap layer and the second cap layer may be either n-type or p-type regardless of the conductive type of the substrate.

The semiconductor laser element according to the present invention can be applicable to the field of high speed information processing, telecommunication, measurement, medical and printing area because of its high reliability under high output power as a light source. And it is applicable as an excitation light source for solid state lasers and wavelength conversion elements.

What is claimed is:

1. A semiconductor laser element comprising:
    a substrate of GaAs of a first conductive type;
    a lower cladding layer of the first conductive type, formed above said GaAs substrate;
    a lower optical waveguide layer of the first conductive type or an undoped type, formed above said lower cladding layer;
    a lower GaAs layer, formed above said lower optical waveguide layer;
    an active layer of $In_{x1}Ga_{1-x1}As_{1-y1}P_{y1}$ where $0.49y1<x1\leq 0.4$ and $0\leq y1\leq 0.1$, formed above said lower GaAs layer;
    an upper GaAs layer, formed above said active layer;
    an upper optical waveguide layer of a second conductive type or an undoped type, formed above said upper GaAs layer;
    an upper cladding layer of the second conductive type, formed above said upper optical waveguide layer; and
    a contact layer of the second conductive type, formed above said upper cladding layer;
    a bandgap energy of said upper and lower optical waveguide layers being greater than a bandgap energy of said active layer; wherein
        said upper GaAs layer, said active layer and at least a portion of said lower GaAs layer are formed in regions excluding at least the vicinities of emission end facets of a resonator, and end portions of said upper optical waveguide layer are formed so that they fill in said vicinity of the emission end facets.

2. A semiconductor laser element according to claim 1, wherein:
    said contact layer of the second conductive type is formed in a region excluding said vicinity of end facets;
    an insulative film with an opening for current injection is formed between said upper cladding layer of the second conductive type and said contact layer of the second conductive type, and an electrode is formed at least on said opening.

3. A semiconductor laser element according to claim 1, further having a GaAs layer of a thickness of approximately 20 nm formed beneath said upper optical waveguide layer.

4. A semiconductor laser element according to claim 2, further having a GaAs layer of a thickness of approximately 20 nm formed beneath said upper optical waveguide layer.

5. A semiconductor laser element according to claim 1, further comprising:
    a refractive index waveguide mechanism formed by a ridge structure.

6. A semiconductor laser element according to claim 2, further comprising:
    a refractive index waveguide mechanism formed by a ridge structure.

7. A semiconductor laser element according to claim 3, further comprising:

a refractive index waveguide mechanism formed by a ridge structure.

8. A semiconductor laser element according to claim 1, further comprising:
a refractive index waveguide mechanism formed by an internal current confinement structure.

9. A semiconductor laser element according to claim 2, further comprising:
a refractive index waveguide mechanism formed by an internal current confinement structure.

10. A semiconductor laser element according to claim 3, further comprising:
a refractive index waveguide mechanism formed by an internal current confinement structure.

11. A semiconductor laser element according to claim 1, further comprising:
a first etching block layer of $In_{x9}Ga_{1-x9}P$ of the second conductive type where $0 \leq x9 \leq 1$, formed above said upper optical waveguide layer;
a second etching block layer of GaAs, formed above the first etching block layer;
a current confinement layer of $In_{0.5}(Ga_{1-z4}Al_{z4})_{0.5}P$ of the first conductive type where $0 \leq z4 \leq 4$, formed above the second GaAs etching block layer; and
a cap layer of an InGaP family crystal lattice matched to GaAs, formed above the current confinement layer; wherein:
an opening of a width from approximately 1 μm to approximately 4 μm is formed from one end facet of the resonator to the other end facet in said cap layer, said current confinement layer and said second etching block layer; and
the opening is filled in by said upper cladding layer of the second conductive type and said contact layer of the second conductive type, said upper cladding layer of the second conductive type being formed beneath said contact layer of the second conductive type.

12. A semiconductor laser element according to claim 2, further comprising:
a first etching block layer of $In_{x9}Ga_{1-x9}P$ of the second conductive type where $0 \leq x9 \leq 1$, formed above said upper optical waveguide layer;
a second etching block layer of GaAs, formed above the first etching block layer;
a current confinement layer of $In_{0.5}(Ga_{1-z4}Al_{z4})_{0.5}P$ of the first conductive type where $0 \leq z4 \leq 1$, formed above the second GaAs etching block layer; and
a cap layer of an InGaP family crystal lattice matched to GaAs, formed above the current confinement layer; wherein:
an opening of a width from approximately 1 μm to approximately 4 μm is formed from one end facet of the resonator to the other end facet in said cap layer, said current confinement layer and said second etching block layer; and
the opening is filled in by said upper cladding layer of the second conductive type and said contact layer of the second conductive type, said upper cladding layer of the second conductive type being formed beneath said contact layer of the second conductive type.

13. A semiconductor laser element according to claim 3, further comprising:
a first etching block layer of $In_{x9}Ga_{1-x9}P$ of the second conductive type where $0 \leq x9 \leq 1$, formed above said upper optical waveguide layer;
a second etching block layer of GaAs, formed above the first etching block layer;
a current confinement layer of $In_{0.5}(Ga_{1-z4}Al_{z4})_{0.5}P$ of the first conductive type where $0 \leq z4 \leq 1$, formed above the second GaAs etching block layer; and
a cap layer of an InGaP family crystal lattice matched to GaAs, formed above the current confinement layer; wherein:
an opening of a width from approximately 1 μm to approximately 4 μm is formed from one end facet of the resonator to the other end facet in said cap layer, said current confinement layer and said second etching block layer; and
the opening is filled in by said upper cladding layer of the second conductive type and said contact layer of the second conductive type, said upper cladding layer of the second conductive type being formed beneath said contact layer of the second conductive type.

14. A semiconductor laser element according to claim 11, further comprising:
another upper cladding layer of $Al_{z1}Ga_{1-z1}As$ of the second conductive type where $0.25 \leq z1 \leq 0.8$, formed between said upper optical waveguide layer and said first etching block layer.

15. A semiconductor laser element according to claim 12, further comprising:
another upper cladding layer of $Al_{z1}Ga_{1-z1}As$ of the second conductive type where $0.25 \leq z1 \leq 0.8$, formed between said upper optical waveguide layer and said first etching block layer.

16. A semiconductor laser element according to claim 13, further comprising:
another upper cladding layer of $Al_{z1}Ga_{1-z1}As$ of the second conductive type where $0.25 \leq z1 \leq 0.8$, formed between said upper optical waveguide layer and said first etching block layer.

17. A semiconductor laser element according to claim 1, wherein said upper cladding layer of the second conductive type is made of a first upper cladding layer of the second conductive type and a second upper cladding layer of the second conductive type, said upper cladding layer of the second conductive type comprising:
said first upper cladding layer of the second conductive type of $Al_{z1}Ga_{1-z1}As$ where $0.25 \leq z1 \leq 0.8$, formed above said upper optical waveguide layer;
a first etching block layer of GaAs of the second conductive type, formed above the first upper cladding layer;
a second etching block layer of $In_{x8}Ga_{1-x8}P$ where $0 \leq x8 \leq 1$, formed above the first etching block layer;
a current confinement layer of $Al_{z3}Ga_{1-z3}As$ where $z1 < z3 \leq 0.8$, formed above the second etching block layer; and
a cap layer of GaAs, formed above the current confinement layer; wherein:
an opening of a width from approximately 1 μm to approximately 4 μm is formed from one end facet of the resonator to the other end facet in said cap layer, said current confinement layer and said second etching block layer; and
the opening is filled in by said second upper cladding layer of the second conductive type and said contact layer of the second conductive type, said second upper cladding layer being formed beneath said contact layer of the second conductive type.

18. A semiconductor laser element according to claim 2, wherein said upper cladding layer of the second conductive type is made of a first upper cladding layer of the second conductive type and a second upper cladding layer of the second conductive type, said upper cladding layer of the second conductive type comprising:

said first upper cladding layer of the second conductive type of $Al_{z1}Ga_{1-z1}As$ where $0.25 \leq z1 \leq 0.8$, formed above said upper optical waveguide layer;

a first etching block layer of GaAs of the second conductive type, formed above the first upper cladding layer;

a second etching block layer of $In_{x8}Ga_{1-x8}P$ where $0 \leq x8 \leq 1$, formed above the first etching block layer;

a current confinement layer of $Al_{z3}Ga_{1-z3}As$ where $z1 < z3 \leq 0.8$, formed above the second etching block layer; and a cap layer of GaAs, formed above the current confinement layer; wherein:

an opening of a width from approximately 1 μm to approximately 4 μm is formed from one end facet of the resonator to the other end facet in said cap layer, said current confinement layer and said second etching block layer; and the opening is filled in by said second upper cladding layer of the second conductive type and said contact layer of the second conductive type, said second upper cladding layer being formed beneath said contact layer of the second conductive type.

19. A semiconductor laser element according to claim 3, wherein said upper cladding layer of the second conductive type is made of a first upper cladding layer of the second conductive type and a second upper cladding layer of the second conductive type, said upper cladding layer of the second conductive type comprising:

said first upper cladding layer of the second conductive type of $Al_{z1}Ga_{1-z1}As$ where $0.25 \leq z1 \leq 0.8$, formed above said upper optical waveguide layer;

a first etching block layer of GaAs of the second conductive type, formed above the first upper cladding layer;

a second etching block layer of $In_{x8}Ga_{1-x8}P$ where $0 \leq x8 \leq 1$, formed above the first etching block layer;

a current confinement layer of $Al_{z3}Ga_{1-z3}As$ where $z1 < z3 \leq 0.8$, formed above the second etching block layer; and a cap layer of GaAs, formed above the current confinement layer; wherein:

an opening of a width from approximately 1 μm to approximately 4 μm is formed from one end facet of the resonator to the other end facet in said cap layer, said current confinement layer and said second etching block layer; and the opening is filled in by said second upper cladding layer of the second conductive type and said contact layer of the second conductive type, said second upper cladding layer being formed beneath said contact layer of the second conductive type.

20. A semiconductor laser element according to claim 1, wherein:

said upper cladding layer of the second conductive type being made of a first upper cladding layer of the second conductive type and a second upper cladding layer of the second conductive type, said upper cladding layer of the second conductive type comprising:

said first upper cladding layer of the second conductive type of an InGaP family crystal lattice matched to GaAs, formed above said upper optical waveguide layer;

an etching block layer of GaAs, formed above the first upper cladding layer;

a current confinement layer of the first conductive type of $In_{0.5}(Ga_{1-z4}Al_{z4})_{0.5}P$ where $0 \leq z4 \leq 1$, formed above the etching block layer; and a cap layer made of an InGaP family crystal lattice matched to GaAs, formed above the current confinement layer; wherein:

an opening of a width from approximately 1 μm to approximately 4 μm is formed from one end facet of the resonator to the other end facet in said cap layer, said current confinement layer and said etching block layer; and the opening is filled in by said second upper cladding layer of the second conductive type and said contact layer of the second conductive type, said second upper cladding layer of the second conductive type being formed beneath said contact layer of the second conductive type.

21. A semiconductor laser element according to claim 2, wherein:

said upper cladding layer of the second conductive type being made of a first upper cladding layer of the second conductive type and a second upper cladding layer of the second conductive type, said upper cladding layer of the second conductive type comprising:

said first upper cladding layer of the second conductive type of an InGaP family crystal lattice matched to GaAs, formed above said upper optical waveguide layer;

an etching block layer of GaAs, formed above the first upper cladding layer;

a current confinement layer of the first conductive type of $In_{0.5}(Ga_{1-z4}Al_{z4})_{0.5}P$ where $0 \leq z4 \leq 1$, formed above the etching block layer; and a cap layer made of an InGaP family crystal lattice matched to GaAs, formed above the current confinement layer; wherein:

an opening of a width from approximately 1 μm to approximately 4 μm is formed from one end facet of the resonator to the other end facet in said cap layer, said current confinement layer and said etching block layer; and the opening is filled in by said second upper cladding layer of the second conductive type and said contact layer of the second conductive type, said second upper cladding layer of the second conductive type being formed beneath said contact layer of the second type.

22. A semiconductor laser element according to claim 3, wherein:

said upper cladding layer of the second conductive type being made of a first upper cladding layer of the second conductive type and a second upper cladding layer of the second conductive type, said upper cladding layer of the second conductive type comprising:

said first upper cladding layer of the second conductive type of an InGaP family crystal lattice matched to GaAs, formed above said upper optical waveguide layer;

an etching block layer of GaAs, formed above the first upper cladding layer;

a current confinement layer of the first conductive type of $In_{0.5}(Ga_{1-z4}Al_{z4})_{0.5}P$ where $0 \leq z4 \leq 1$, formed above the etching block layer; and a cap layer made of an InGaP family crystal lattice matched to GaAs, formed above the current confinement layer; wherein:

an opening of a width from approximately 1 µm to approximately 4 µm is formed from one end facet of the resonator to the other end facet in said cap layer, said current confinement layer and said etching block layer; and the opening is filled in by said second upper cladding layer of the second conductive type and said contact layer of the second conductive type, said second upper cladding layer of the second conductive type being formed beneath said contact layer of the second type.

23. A semiconductor laser element according to claim 1, wherein:

said optical waveguide layer is made of $Al_{z2}Ga_{1-z2}As$ where $0<z2<0.8$ or $In_{x2}Ga_{1-x2}As_{1-y2}P_{y2}$ where $0<y2\leq 1$, $x2=0.49y2$.

24. A semiconductor laser element according to claim 2, wherein:

said optical waveguide layer is made of $Al_{z2}Ga_{1-z2}As$ where $0<z2<0.8$ or $In_{x2}Ga_{1-x2}As_{1-y2}P_{y2}$ where $0<y2\leq 1$, $x2=0.49y2$.

25. A semiconductor laser element according to claim 3, wherein:

said optical waveguide layer is made of $Al_{z2}Ga_{1-z2}As$ where $0<z2<0.8$ or $In_{x2}Ga_{1-x2}As_{1-y2}P_{y2}$ where $0<y2\leq 1$, $x2=0.49y2$.

26. A semiconductor laser element according to claim 1, further comprising:

a barrier layer of $In_{x4}Ga_{1-x4}As_{1-y4}P_{y4}$ where $0\leq x4<0.49y4$, $0<y4\leq 0.6$ whose bandgap energy is greater than that of said active layer, having a tensile-strain and being formed adjacent to said active layer.

27. A semiconductor laser element according to claim 2, further comprising:

a barrier layer of $In_{x4}Ga_{1-x4}As_{1-y4}P_{y4}$ where $0\leq x4<0.49y4$, $0<y4\leq 0.6$ whose bandgap energy is greater than that of said active layer, having a tensile-strain and being formed adjacent to said active layer.

28. A semiconductor laser element according to claim 3, further comprising:

a barrier layer of $In_{x4}Ga_{1-x4}As_{1-y4}P_{y4}$ where $0\leq x4<0.49y4$, $0<y4\leq 0.6$ whose bandgap energy is greater than that of said active layer, having a tensile-strain and being formed adjacent to said active layer.

* * * * *